(12) United States Patent
Kim et al.

(10) Patent No.: US 7,205,208 B2
(45) Date of Patent: Apr. 17, 2007

(54) METHOD OF MANUFACTURING A SEMICONDUCTOR DEVICE

(75) Inventors: Dong-Hyun Kim, Suwon-si (KR); Du-Heon Song, Yonging-si (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/147,312

(22) Filed: Jun. 8, 2005

(65) Prior Publication Data

US 2005/0272199 A1 Dec. 8, 2005

(30) Foreign Application Priority Data

Jun. 8, 2004 (KR) ............... 10-2004-0041636

(51) Int. Cl.
| | |
|---|---|
| H01L 21/76 | (2006.01) |
| H01L 21/4763 | (2006.01) |
| H01L 21/3205 | (2006.01) |
| H01L 21/336 | (2006.01) |

(52) U.S. Cl. ............ 438/427; 438/428; 438/430; 438/589; 438/259; 438/270; 257/E21.564; 257/E21.577; 257/E21.166; 257/E21.583; 257/E21.585

(58) Field of Classification Search ........... 438/427, 438/428, 430, 589
See application file for complete search history.

(56) References Cited

U.S. PATENT DOCUMENTS

| | | | |
|---|---|---|---|
| 4,685,196 A | 8/1987 | Lee et al. ............... 437/41 |
| 5,179,038 A * | 1/1993 | Kinney et al. ........... 438/427 |
| 5,455,194 A * | 10/1995 | Vasquez et al. .......... 438/425 |
| 5,998,835 A | 12/1999 | Furukawa et al. ........ 257/330 |
| 2002/0056872 A1* | 5/2002 | Baliga ..................... 257/330 |
| 2005/0042833 A1 | 2/2005 | Park et al. ............... 438/282 |

* cited by examiner

*Primary Examiner*—Michael Lebentritt
*Assistant Examiner*—Mohsen Ahmadi
(74) *Attorney, Agent, or Firm*—Lee & Morse, P.C.

(57) ABSTRACT

In a method of manufacturing a semiconductor device, a first trench is formed in a first region of a substrate and a second trench is formed in a second region of the substrate different from the first region. A depth of the first trench is less than that of the second trench. An insulation layer is formed in the second trench, so that semiconductor structures in the first trench are electrically isolated, and a conductive layer fills the first trench and extends above the first trench.

16 Claims, 13 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device. More particularly, the present invention relates to a method of manufacturing a semiconductor device having a recessed channel.

2. Description of the Related Art

Recently, as information technologies such as computers have become widespread, semiconductor technology has developed greatly to improve the reliance, data storage capacity and response speed of semiconductor devices by increasing the degree of integration thereof.

As semiconductor devices have become highly integrated, a size of an active region on which various conductive structures are formed has been gradually reduced, so that a channel length of a MOS transistor may be less than or equal to a few microns in the active region.

When the channel length of a MOS transistor is reduced, a source or drain of the MOS transistor, or a voltage applied to a channel region, may have a much greater effect on the electric field in the channel region. This is widely known as the short channel effect. The short channel effect may be manifested as, for example, a threshold voltage drop. This is because the channel region is much more influenced by electrons in a depletion region, the electric field and the voltage distribution of the source and the drain, as well as the gate voltage, when the gate length is shortened.

A dynamic random access memory (DRAM) generally requires high operation speed and data storage capacity, and thus requires many more unit cells in a wafer. The high integration of the unit cell on the wafer requires shortening the gate length of the DRAM, and the shortened gate length leads to a short channel length. The short channel causes various operation failures such as a dynamic failure and a static refresh failure in the DRAM due to the short channel effect.

A lightly doped source/drain (LDD) structure has been the subject of investigation for reducing the short channel effect. However, the LDD structure has a problem of high drain resistance because the channel region and the drain region become more distant from each other.

A transistor having a recessed channel (hereinafter referred to as a "recessed channel transistor") has been proposed for reducing the short channel effect without the resistance increase at the drain evident in the LDD structure. In the recessed channel transistor, an active region of the substrate is recessed to a predetermined depth after a device isolation layer is formed in a trench in a field region, and a gate electrode is formed in the recessed portion (hereinafter referred to as a "gate trench") of the active region. Therefore, a length of the gate electrode is increased without increasing a surface area thereof in a horizontal direction, so that a length of the channel is increased in the recessed channel transistor, while maintaining a small footprint on the substrate.

The design of a recessed channel transistor is such that source and drain regions are formed at surface portions of the substrate symmetrically with respect to the gate electrode. Accordingly, a channel is formed on a portion of sidewalls and a bottom surface of the gate trench in the recessed channel transistor. A remaining portion of the sidewall of the trench that does not make contact with the source/drain regions makes contact with a device isolation layer formed in a trench surrounding an active region. Hereinafter, the trench surrounding the active region is referred to as a "field trench."

When the silicon substrate in the active region is partially etched away to form the gate trench, there is a problem in that the etching process is prohibited due to the device isolation layer in the field trench. Thus, a boundary portion of the active region between the field trench and the gate trench is not etched away, but rather remains to form a silicon fence. In addition, upper portions of the gate and field trenches end up being larger than lower portions thereof due to imperfections in the anisotropic etching process, so that the silicon fence becomes thicker as the depth of the gate trench is increased.

A parasitic channel is formed along the silicon fence in the recessed channel transistor, so that the recessed channel does not effectively increase the channel length. Thus, failures such as the dynamic failure and static refresh failure discussed above are still generated. Removal of the silicon fence requires additional processing steps, resulting in increased manufacturing costs for semiconductor devices.

Accordingly, there is a need for an improved manufacturing method for a recessed channel transistor that avoids the formation of a silicon fence.

SUMMARY OF THE INVENTION

The present invention is therefore directed to methods of manufacturing semiconductor devices that avoid the formation of a silicon fence, which substantially overcome one or more of the problems due to the limitations and disadvantages of the related art.

It is therefore a feature of an embodiment of the present invention to provide a method of manufacturing a semiconductor device wherein a gate trench is formed prior to the formation of a device isolation layer in a field trench.

It is therefore another feature of an embodiment of the present invention to provide a method of manufacturing a semiconductor device wherein a gate trench is formed prior to formation of a field trench.

It is yet another feature of an embodiment of the present invention to provide a method of manufacturing a semiconductor device wherein a gate trench is formed after formation of a field trench.

At least one of the above and other features and advantages of the present invention may be realized by a method of manufacturing a semiconductor device including forming a first trench in a first region of a substrate and a second trench in a second region of the substrate different from the first region, the first trench being shallower than the second trench, forming an insulation layer in the second trench, so that semiconductor structures formed in the first trench are electrically isolated, and forming a conductive layer filling the first trench and extending above the first trench.

Forming the insulation layer may include sequentially forming an oxide layer and a nitride layer along sidewalls and bottoms of the first and second trenches and on a surface of the first region, filling the first and second trenches with an insulation material to thereby form an insulation layer on the substrate such that the insulation layer includes a void in the first trench, polishing the insulation layer until a top surface of the nitride layer is exposed in the first region, so that a portion of the first trench is exposed corresponding to the void, and removing the insulation layer in the first trench.

Forming the conductive layer may include forming a gate insulation layer on a bottom and sidewalls of the first trench and on a surface of the substrate in the first region, filling the first trench with a gate conductive material, and partially and sequentially removing the gate conductive material and the gate insulation layer, so that the gate insulation layer and the gate conductive material remain only in the first trench.

At least one of the above and other features and advantages of the present invention may also be realized by providing a method of fabricating a semiconductor device including forming a preliminary source/drain region on a substrate including a hard mask layer, forming a first trench in an active region of the substrate and a second trench in a field region of the substrate, the second trench defining the active region and being deeper than the first trench, forming an isolation layer by filling the second trench with an insulating material, and forming a gate electrode by filling the first trench with a conductive material.

Forming the first and second trenches may include forming a preliminary trench to a first depth in a first direction, wherein the preliminary trench includes a portion of the active region, and wherein the portion of the preliminary trench corresponding to the active region is formed into a first trench, and forming a second trench in the field region to a second depth greater than the first depth such that the active region is surrounded by the second trench, so that the second trench has a stepped portion on a bottom thereof corresponding to the first depth.

Forming the preliminary trench may include forming a first photoresist pattern on the hard mask layer in the first direction, through which a portion of the active region is exposed, and sequentially etching the hard mask layer and the substrate under the hard mask layer to the first depth using the photoresist pattern as an etching mask, so that the preliminary trench including the portion of the active region is formed in the substrate in the first direction.

Forming the second trench may include forming a second photoresist pattern on the substrate in a second direction substantially perpendicular to the first direction, so that the active region is covered with the second photoresist pattern and the field region surrounding the active region is exposed through the second photoresist pattern and a portion of the preliminary trench in the active region is filled with the second photoresist pattern, etching the substrate in the field region to the second depth using the second photoresist pattern as an etching mask, so that the second trench is formed in the field region around the active region, and removing the second photoresist pattern, so that the portion of the preliminary trench in the active region is exposed to thereby form the first trench.

Forming the first and second trenches may include forming a preliminary trench in the field region of the substrate to a first depth such that the active region is surrounded by the preliminary trench, and forming a second trench in a portion of the active region to a second depth, wherein the second depth is less than the first depth, so that the preliminary trench is formed into a first trench having a stepped portion thereof on a bottom thereof corresponding to the second depth.

Forming the preliminary trench may include forming a first photoresist pattern on the substrate in a first direction substantially parallel with the active region, so that the active region is covered with the first photoresist pattern and the field region surrounding the active region is exposed through the first photoresist pattern, and etching the substrate in the field region to the first depth using the first photoresist pattern as an etching mask, so that the preliminary trench is formed in the field region around the active region to the first depth.

Forming the second trench may include forming a second photoresist pattern through which a portion of the active region is exposed on the hard mask layer in a second direction substantially perpendicular to the first direction, sequentially etching the hard mask layer and the substrate under the hard mask layer to the second depth using the second photoresist pattern as an etching mask, so that a portion of the active region is etched away to the second depth to thereby form the second trench, and a portion of the preliminary trench adjacent to the second trench in the first direction is additionally etched away to thereby form the stepped portion on the bottom of the preliminary trench, and removing the second photoresist pattern, so that the preliminary trench in the field region is exposed to thereby form the first trench.

Forming the device isolation layer may include forming an insulation layer on the substrate to a thickness to fill the first and second trenches such that a void is formed in the first trench, polishing the insulation layer until a top surface of the substrate is exposed in the active region, so that the void is exposed and the first trench is partially opened corresponding to the void, and removing the insulation layer in the first trench, so that the insulation layer remains only in the second trench to form the device isolation layer in the second trench. The method may further include sequentially forming an oxide layer and a nitride layer on bottoms and sidewalls of the first and second trenches and on a surface of the hard mask layer prior to forming the insulation layer, and wherein the insulation layer is polished until a top surface of the hard mask layer is exposed, and the nitride layer and the oxide layer in the active region are sequentially removed. The method may also include providing a hard mask layer comprising a same material as the nitride layer, so that the hard mask layer is removed when the nitride layer is removed. The method may further include forming an overhang around an inlet portion of the first trench in the insulation layer.

Forming the gate electrode may include forming a gate insulation layer on a bottom and sidewalls of the first trench and on the surface of the substrate in the active region, forming a conductive layer on the gate insulation layer to a thickness to fill the first trench, forming a hard mask layer on the conductive layer, and partially and sequentially removing the hard mask layer, the conductive layer and the gate insulation layer such that a residual gate insulation layer remains only in the first trench, and a residual conductive layer and a residual hard mask layer are stacked on the residual gate insulation layer to thereby form the gate electrode in the active region. The conductive layer may include a silicon layer including polycrystalline material, and may further include a tungsten silicide layer on the silicon layer. Removing the hard mask layer, the conductive layer and the gate insulation layer may include forming a photoresist pattern on the hard mask layer, and partially and sequentially dry-etching the hard mask layer, the conductive layer and the gate insulation layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
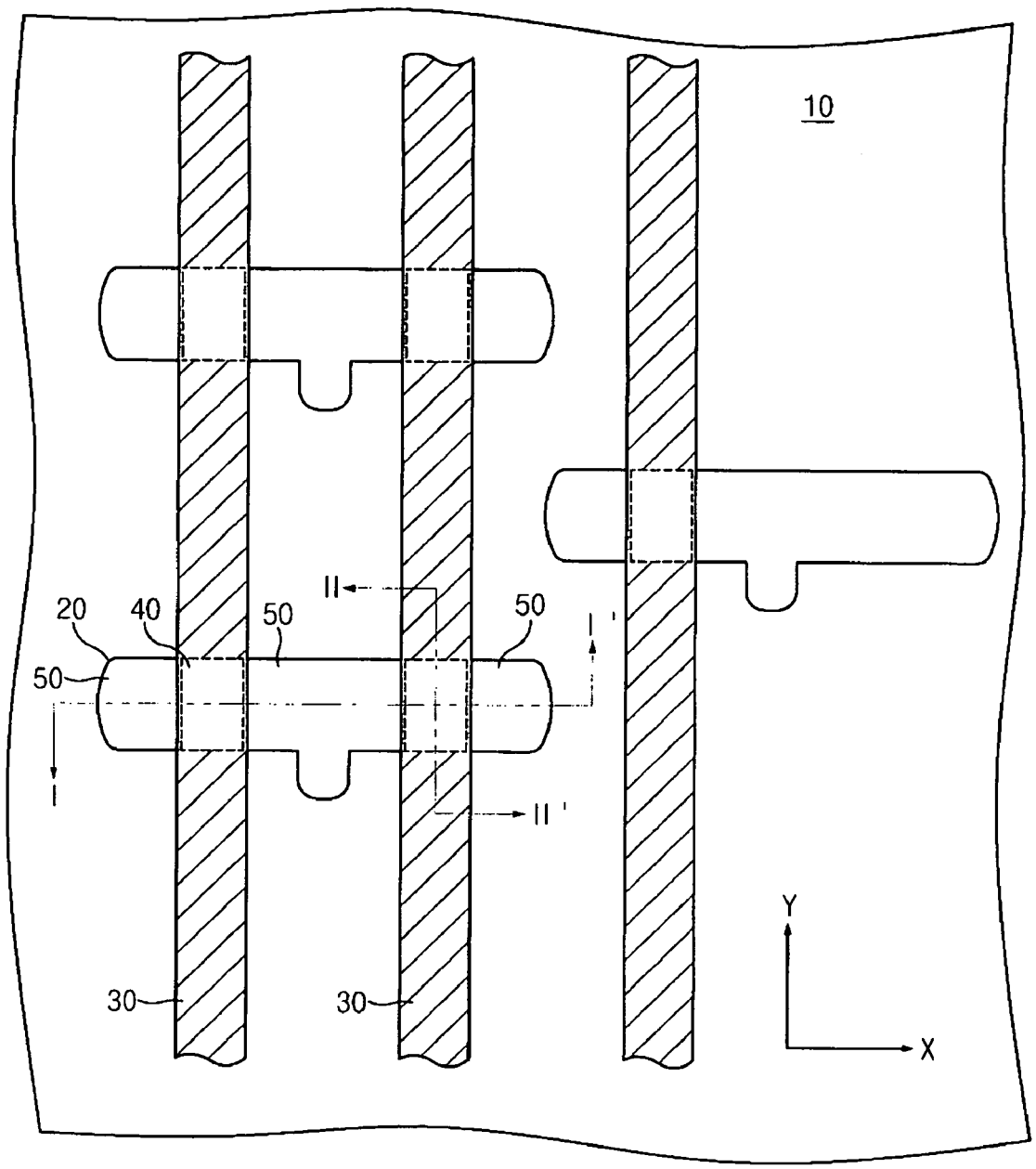
FIG. 1 illustrates a plan view of a recessed channel transistor of the present invention.

Korean Patent Application No. 2004-41636, filed on Jun. 8, 2004, in the Korean Intellectual Property Office, and entitled: "Method of Manufacturing a Semiconductor Device," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a plan view of a recessed channel transistor of the present invention. Referring to FIG. 1, the recessed channel transistor 10 of an embodiment of the present invention is formed on a substrate including an active region 20 and a field region defined by a device isolation layer, e.g., a field oxide layer. The active region 20 extends along an X direction, and wiring 30, e.g., as a word line, extends along a Y direction substantially perpendicular to the X direction. A recessed gate electrode 40 is formed at an intersection point of the active region 20 and the wiring 30. The recessed gate electrode 40 has a width less than a width of the wiring 30, as shown with a dotted line in FIG. 1. Source and drain regions 50 are formed at both sides of the recessed gate electrode 40 on the active region 20 to complete the recessed channel transistor 10.

The following will describe embodiments for making the recessed channel transistor 10 of FIG. 1. In Embodiment 1, the trench for the recessed gate electrode is formed prior to the trench defining the active region. In Embodiment 2, the trench for defining the active region is formed prior to the trench for the recessed gate electrode.

Embodiment 1

FIGS. 2 to 16 illustrate cross-sectional views of stages in a method of manufacturing the recessed channel transistor shown in FIG. 1 according to a first embodiment of the present invention. Odd numbered figures illustrate cross-sectional views taken along a line I–I' of FIG. 1, and even numbered figures illustrate cross-sectional views taken along a line II–II' of FIG. 1.

Figure 2:
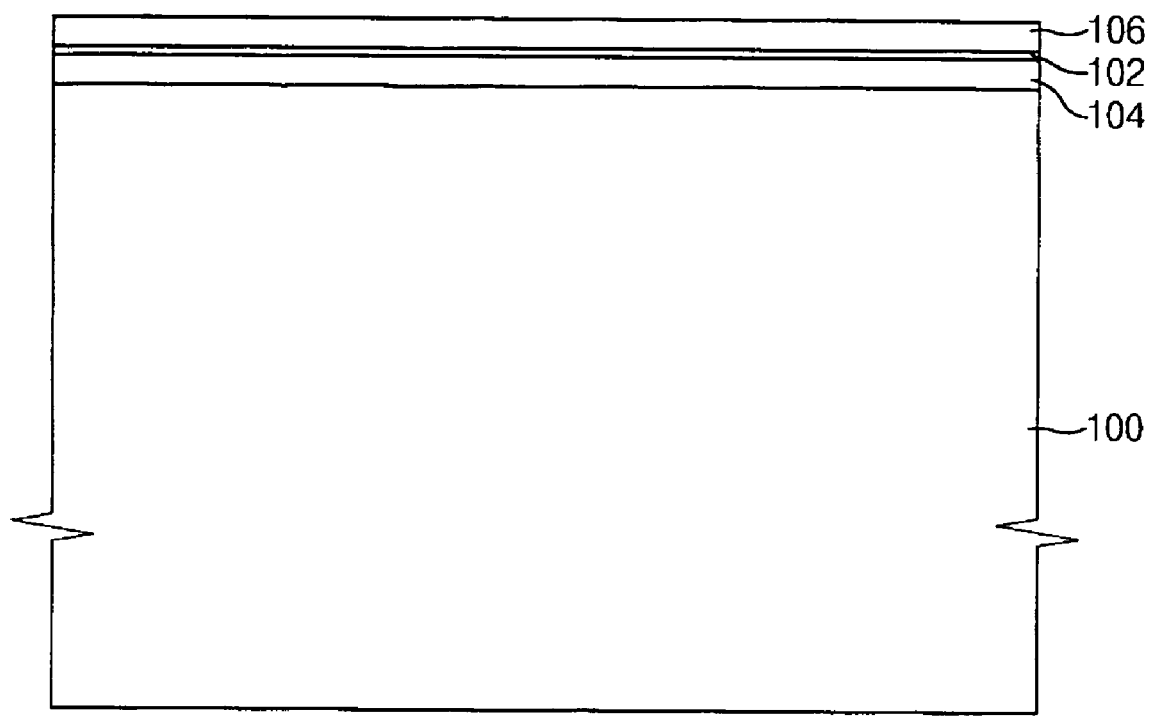
FIGS. 2 to 16 illustrate cross-sectional views of stages in a method of manufacturing the recessed channel transistor shown in FIG. 1 according to a first embodiment of the present invention.

Referring FIG. 2, a pad oxide layer 102 is formed on a semiconductor substrate 100, e.g., a P-type silicon wafer by, e.g., a thermal oxidation process. Then, N-type impurities are implanted onto the substrate 100 and preliminary source/drain regions 104 are formed under the pad oxide layer 102. Prior to formation of the preliminary source/drain regions 104, P-type impurities may also be implanted into the substrate 100, e.g., to control a threshold voltage.

Next, a hard mask layer 106 is formed on the pad oxide layer 102. The hard mask layer 106 may be a silicon nitride layer formed on the pad oxide layer 102 by a low-pressure chemical vapor deposition (LPCVD) process. The silicon nitride layer has an etching selectivity with respect to the silicon substrate 100.

Figure 3:
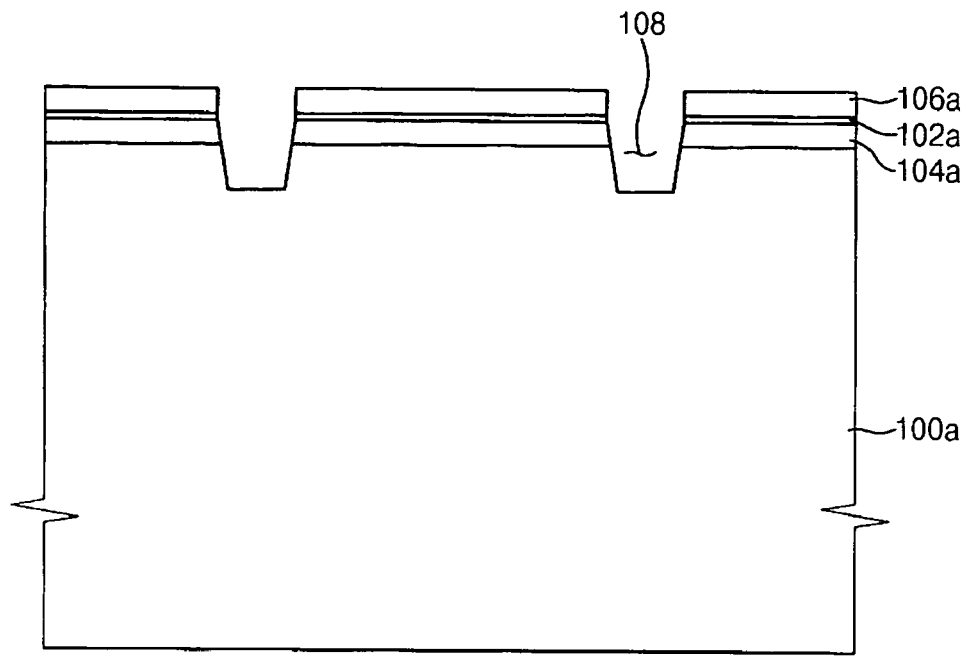
Figure 4:
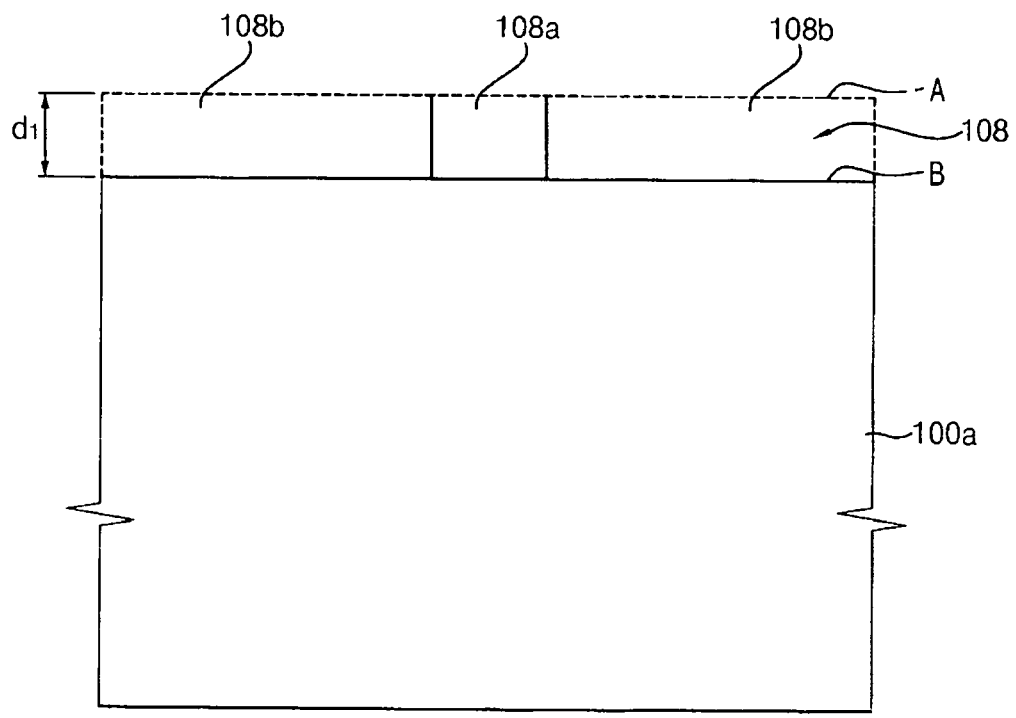

Referring to FIGS. 3 and 4, a first photoresist film (not shown) is provided on the hard mask layer 106, and a first photoresist pattern (not shown) is formed in the Y direction in FIG. 1 by a conventional photo process (exposing and developing), so that a portion of the hard mask layer 106 is exposed through the first photoresist pattern in the Y direction.

The exposed hard mask layer 106 may be partially removed, e.g., by a dry etching process, using the first photoresist pattern as an etching mask, to thereby form a hard mask pattern 106a on the pad oxide layer 102. The pad oxide layer 102 is partially exposed through the hard mask pattern 106a in the Y direction. The pad oxide layer 102 and the substrate 100 under the pad oxide layer 102 are sequentially and partially etched away using the hard mask pattern 106a as an etching mask. Accordingly, a pad oxide pattern 102a and a preliminary trench 108 are formed on the substrate 100 in the Y direction. The substrate 100 including the preliminary trench 108 is designated by reference numeral 100a in FIG. 3. In FIG. 4, a dotted line A represents a top surface of the substrate 100a and a solid line B under the dotted line A represents a bottom surface of the first trench 108. The distance between the solid line B and the dotted line A in FIG. 4 indicates a first etching depth $d_1$ of the preliminary trench 108. In a subsequent process, a recessed gate electrode is to be formed at a portion of the preliminary trench 108 crossing the active region 20 of the substrate 100a, so that the preliminary trench 108 becomes divided into a first area 108a, crossing the active region 20 of the substrate 100a, and a second area 108b, corresponding to a residual region of the preliminary trench 108 except for the first area 108a.

Figure 5:
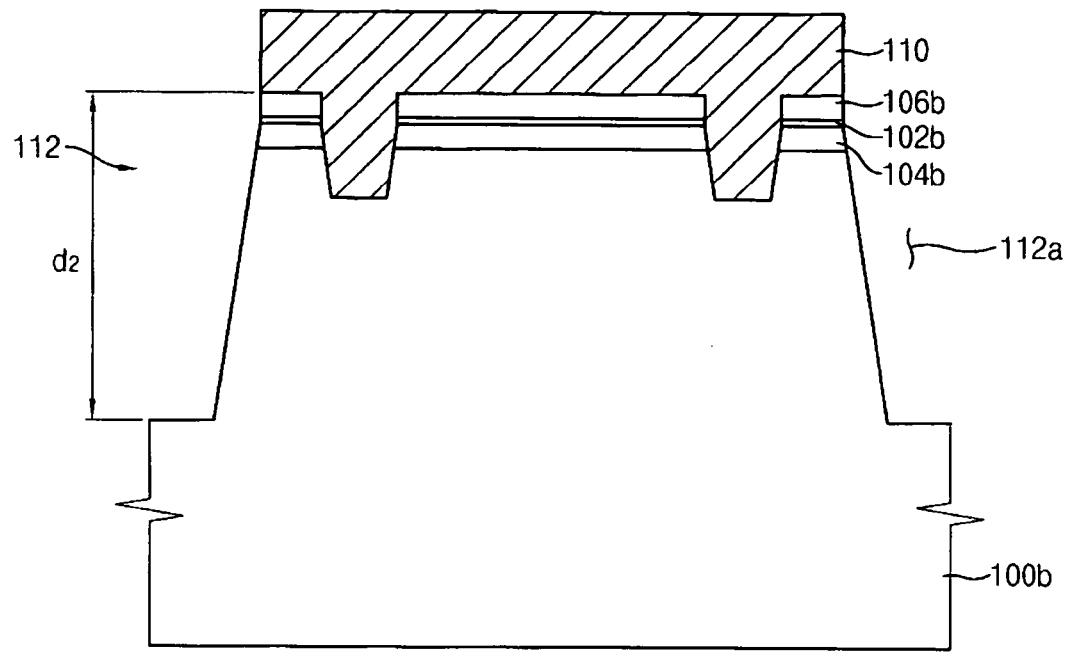
Figure 6:
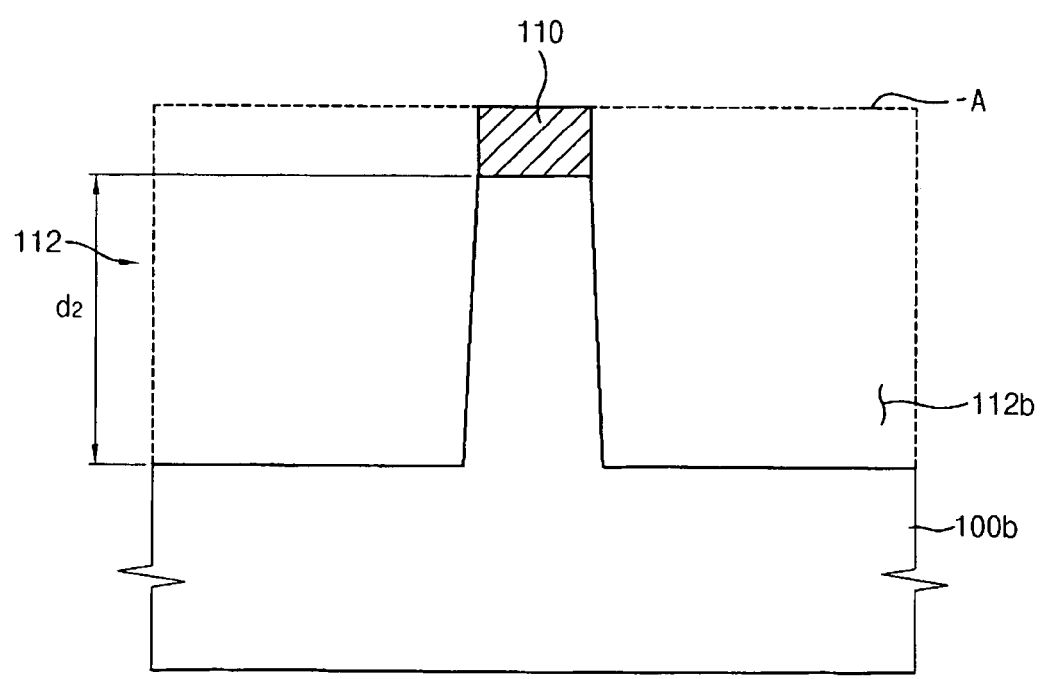

Referring to FIGS. 5 and 6, a photoresist material is again provided on the substrate 100a including the preliminary trench 108 to thereby form a second photoresist film (not shown) on the substrate 100a. Then, a photo process is performed on the second photoresist film to form a second photoresist pattern 110 on the substrate 100a in an X direction substantially perpendicular to the Y direction, as shown in FIG. 1. In the present embodiment, the second photoresist pattern covers the active region of the substrate 100a and exposes a field region of the substrate 100a therethrough because the active region extends to the X direction. The field region surrounds the active region 20 (shown in FIG. 1), and thus defines the active region 20. That is, the second photoresist pattern 110 is formed around the active region of the substrate 100a.

The first area 108a of the preliminary trench 108 is filled with the second photoresist pattern 110, and the second area 108b of the preliminary trench 108 remains open. The recessed gate electrode 40 is formed on the first area 108a of the preliminary trench 108 in a subsequent process.

The substrate 100a is removed, e.g., dry-etched away, to a second etching depth $d_2$ using the second photoresist pattern 110 as an etching mask to form a second trench 112 on the field region of the substrate 100a, the second trench 112 having the second etching depth $d_2$. In the present embodiment, the second etching depth $d_2$ is greater than the first etching depth $d_1$.

The field region of the substrate 100a includes a recessed area and a non-recessed area. The recessed area of the field region corresponds to the second area 108b of the preliminary trench 108 that is recessed to the first etching depth $d_1$ from the top surface of the substrate 100a, and the non-recessed area of the field region has not undergone etching. That is, the top surface of the substrate 100a is not recessed in the non-recessed area, the hard mask pattern 106a still remains on the substrate 100a and a naked substrate is exposed on the bottom of the preliminary trench 108, without the hard mask pattern 106a in the recessed area.

The etching process for the second trench is performed at the bottom in the second area 108b of the preliminary trench 108 and at a top surface of the hard mask pattern 106a in the non-recessed region of the substrate 100a. That is, while the hard mask pattern 106a, the pad oxide pattern 102a underlying the hard mask pattern 106a and the substrate 100a underlying the pad oxide pattern 102a are sequentially and partially etched away in the non-recessed region of the substrate 100a, the bottom surface is directly etched away in the second area 108a. Since the bottom surface of the second area 108b is lower than the top surface of the substrate 100a of the non-recessed area, the second trench 112 at the second area 108b is formed to be lower than at the non-recessed area by the first etching depth $d_1$. Hereinafter, the second trench 112 at the non-recessed region is referred to as a shallow second trench 112a, and the second trench 112 at the second area 108b of the preliminary trench 108 is referred to as a deep second trench 112b.

The second trench 112 is formed in the field region of the substrate 100a to the second etching depth $d_2$ using the second photoresist pattern 110 as an etching mask, and the second trench 112 includes the shallow second trench 112a and the deep second trench 112b having a step difference with each other corresponding to the first etching depth $d_1$. The substrate 100a including the second trench 112 is designated by reference numeral 100b, and the hard mask pattern 106a formed on the substrate 100b is designated by reference numeral 106b in FIG. 5. In the same way, the pad oxide layer 102a and the preliminary source/drain regions 104a on the substrate 100b are designated by reference numerals 102b and 104b, respectively, in FIG. 5.

Figure 7:
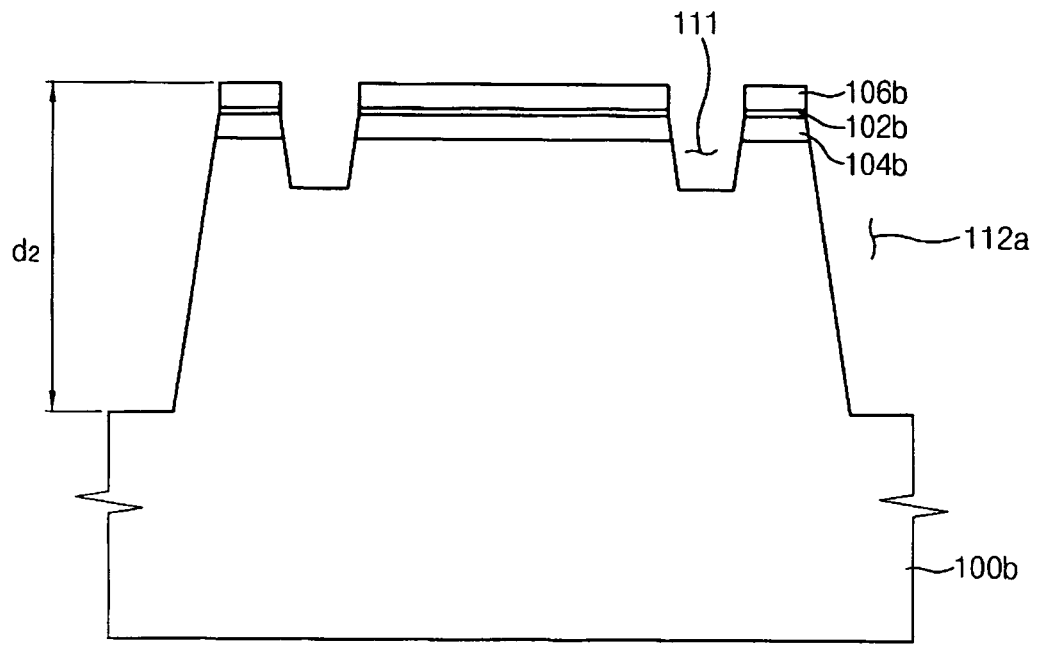
Figure 8:
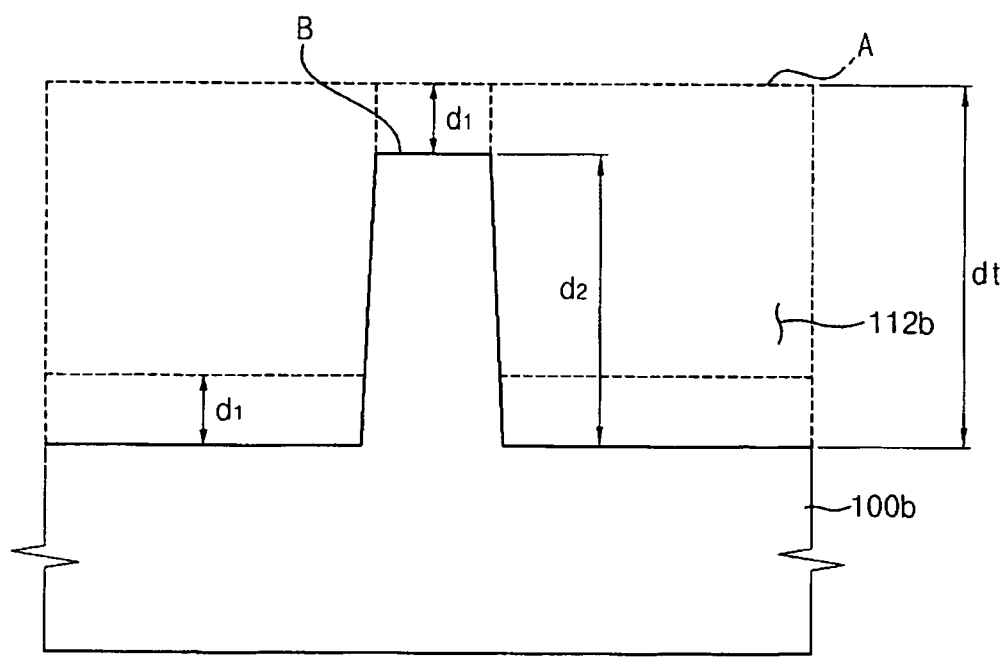

Referring to FIGS. 7 and 8, once the second photoresist pattern 110 is removed from the substrate 100b, the first area 108a of the preliminary trench 108 is open and the second trench 112 is formed around the active region including the first area 108a. Hereinafter, the first area 108a of the preliminary trench 108 is referred to as a first trench 111 compared with the second trench 112. That is, the first trench 111 is formed during the etching process forming the second trench 112. The first area 108a is formed into the first trench 111 and the second area 108b is formed into the deep second trench 112b of the second trench 112. Consequently, the substrate 100b includes the second trench 112 defining the active region and has the step difference corresponding to the first etching depth $d_1$, and a first trench 111 in which the recessed gate electrode is formed. The preliminary source/drain regions 104 adjacent to the first trench 111 are formed into source/drain regions 104b.

As shown in FIG. 8, the shallow second trench 112a and the deep second trench 112b have the same etching depth, corresponding to the second etching depth $d_2$. A total depth $d_t$ of the deep second trench 112b is greater than the depth of the shallow second trench 112a by the first etching depth $d_1$.

The first trench 111, functioning as a gate trench, is formed prior to the second trench 112, functioning as a field trench, without a device isolation layer in the field trench. The device isolation layer in the field trench is not an obstacle to the etching process for the gate trench, and thus the silicon fence between the gate trench and the field trench may be avoided.

Figure 9:
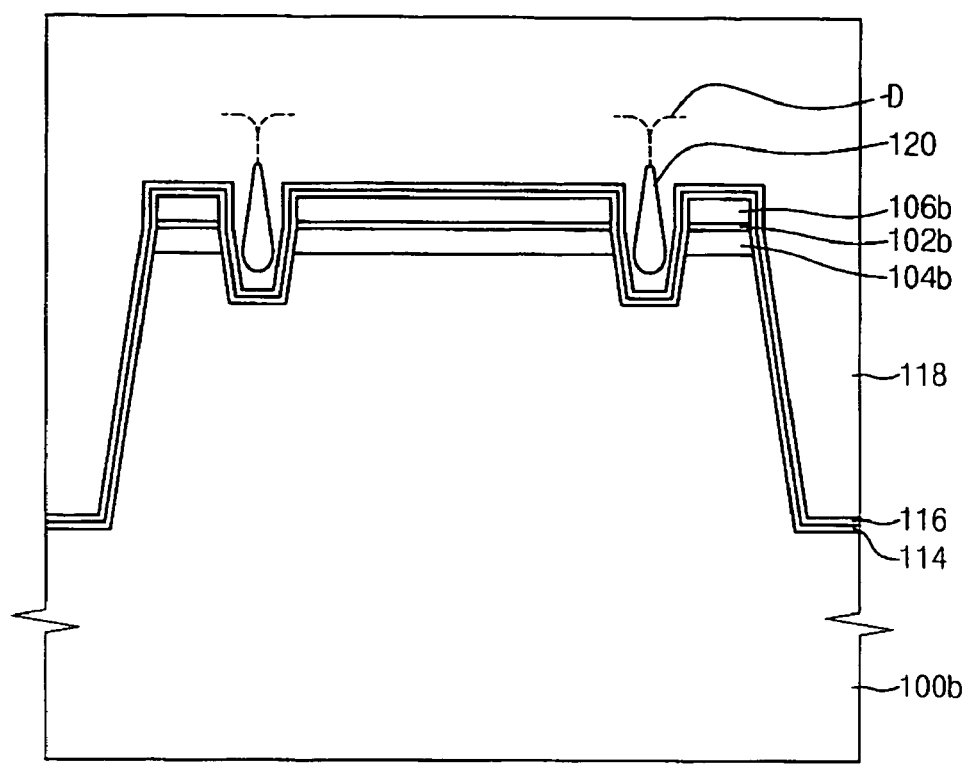
Figure 10:
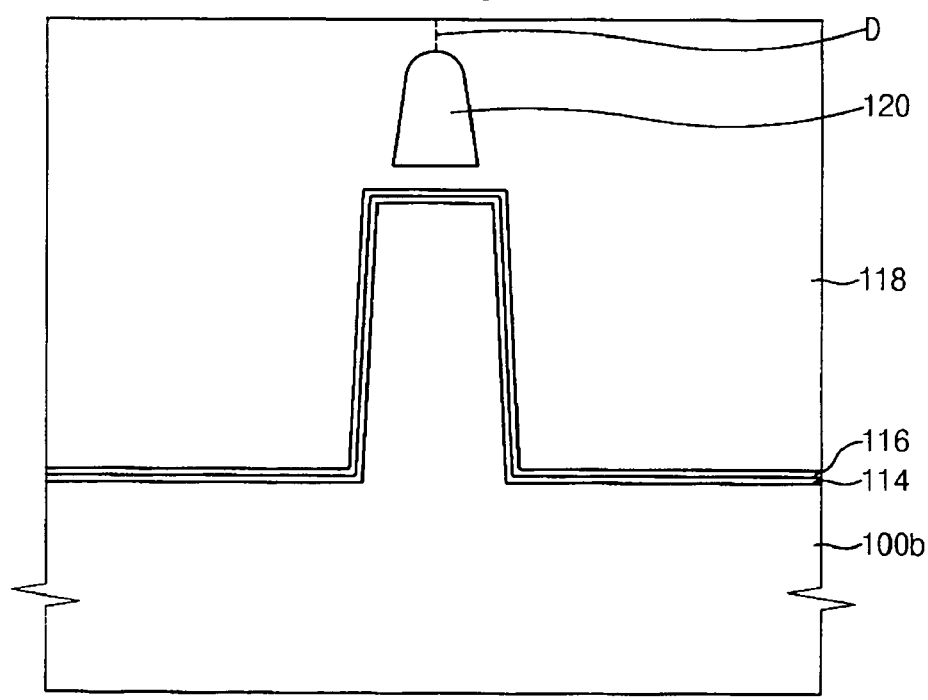

Referring to FIGS. 9 and 10, a sidewall layer, e.g., a sidewall oxide layer 114, and a liner layer, e.g., a liner nitride layer 116, may be sequentially formed on sidewalls and bottoms of the first trench 111 and second trench 112 and on the top surface of the hard mask pattern 106b in the active region 20. A thermal oxidation process may be utilized for the sidewall oxide layer 114, and a low-pressure chemical vapor deposition process may be utilized for the liner nitride layer 116.

The sidewall oxide layer 114 and the liner nitride layer 116 may help prevent stresses due to a difference in the coefficient of thermal expansion between a device isolation layer and the substrate 100b, and may also help prevent contaminants generated from the device isolation layer from infiltrating the active region.

An insulation material is deposited onto the substrate 100b, e.g., by a high density plasma chemical vapor deposition (HDPCVD) process, to a sufficient thickness to fill the first trench 111 and second trench 112 and to form an insulation layer 118 on the liner nitride layer 116.

The deposition conditions may be controlled such that a gap-fill property of the insulation layer 118 is good in the second trench 112 and is poor in the first trench 111. As a result, the insulation layer 118 is formed in the second trench 112 without any processing failures, but is intentionally formed in the first trench 111 with an overhang failure D (represented in dotted lines in FIGS. 9 and 10) around an inlet portion of the first trench 111 to generate a void 120 at an interior region of the insulation layer 118 in the first trench 111.

Figure 11:
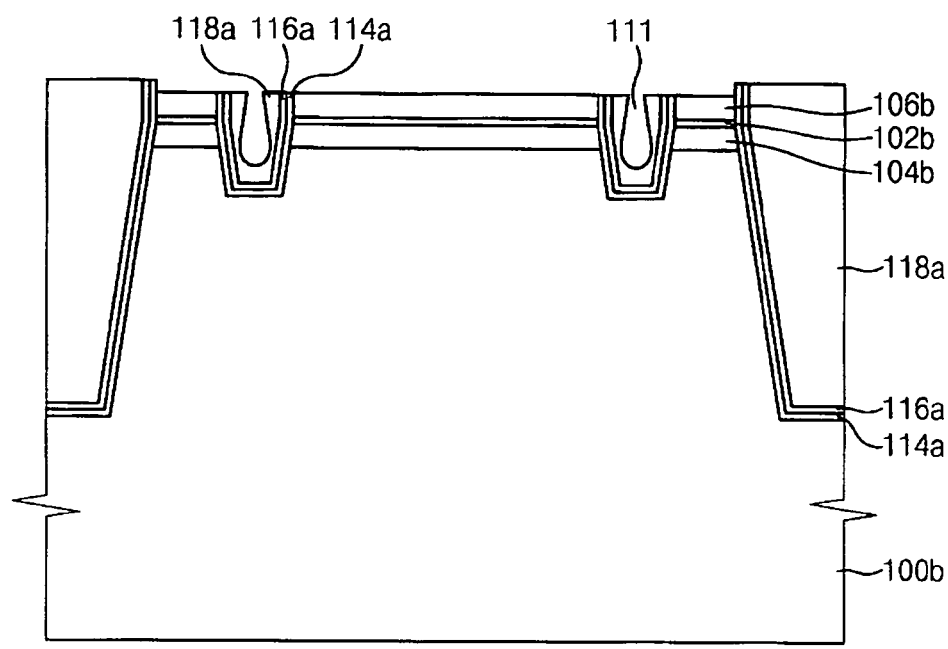
Figure 12:
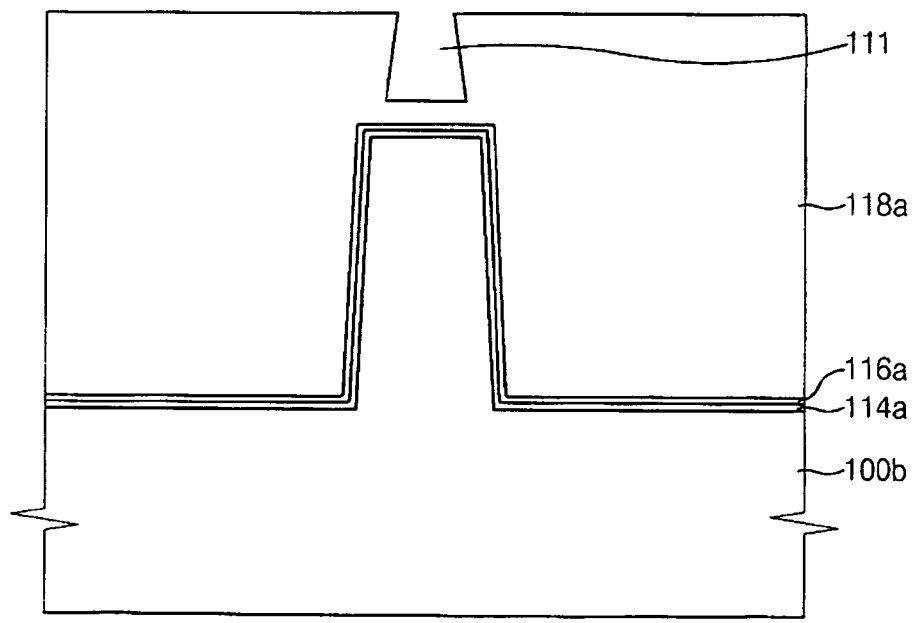

Referring to FIGS. 11 and 12, the insulation layer 118 is removed, e.g., by a chemical mechanical polishing (CMP) process, until the top surface of the hard mask pattern 106b is exposed, so that a residual insulation layer 118a, a residual nitride layer 116a and a residual oxide layer 114a remain in the first trench 111 and second trench 112. Here, the liner nitride layer 116 is polished more than the insulation layer 118 during the CMP process, so that a top surface of the residual insulation layer 118a in the second trench 112 is higher than the top surface of the hard mask pattern 106b. In addition, the void 120 inside the insulation layer 118 is exposed, and the first trench 111 that is filled with the insulation layer 118 corresponds to the void 120.

Figure 13:
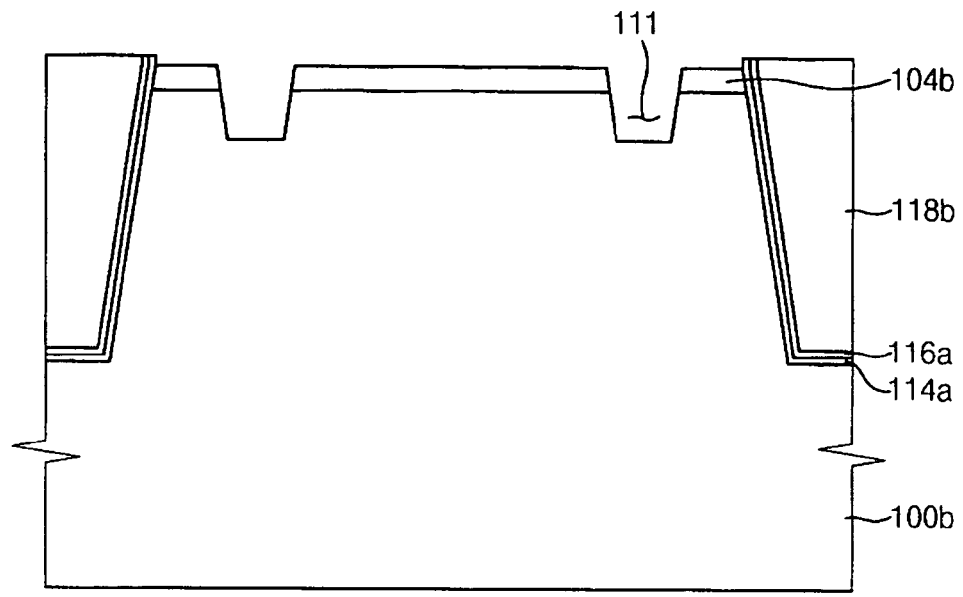
Figure 14:
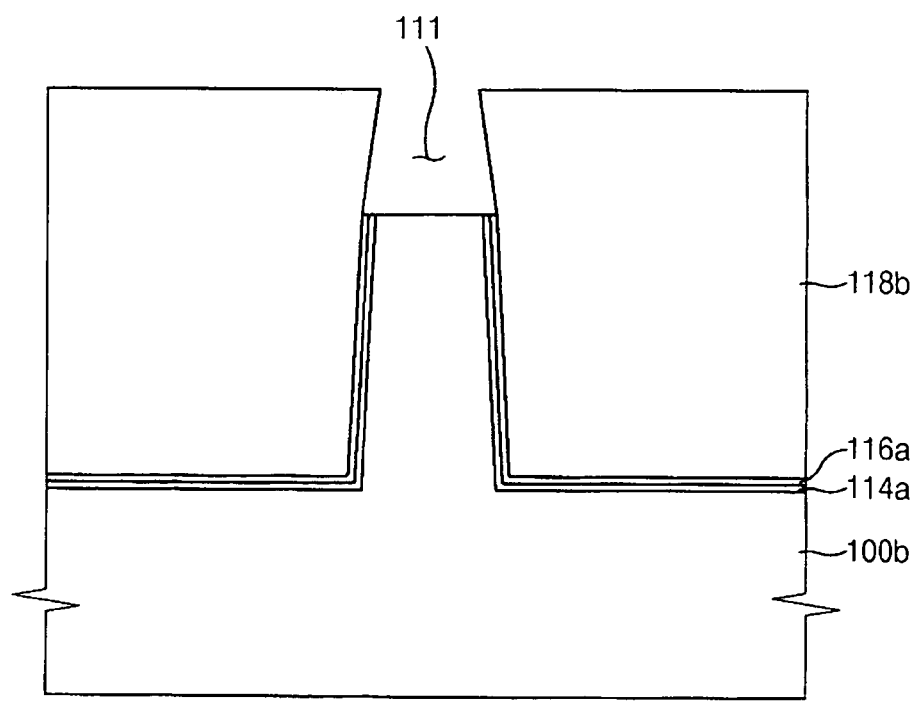

Referring to FIGS. 13 and 14, the residual insulation layers 118a in the first and second trenches 111 and 112 are removed, e.g., by a wet etching process, so that the residual insulation layer 118a is completely removed and the liner nitride layer 116a is exposed in the first trench 111. The residual insulation layer 118a in the second trench 112 is removed corresponding to a thickness of the residual insulation layer 118a in the first trench 111, so that the residual insulation layer 118a in the second trench 112 is lowered as much as the thickness of the residual insulation layer in the first trench 111. Subsequently, the residual liner nitride layer 116a exposed in the first trench 111 is also removed, e.g., by a wet etching process, to thereby expose the residual sidewall oxide layer 114a in the first trench 111, and the residual liner nitride layer 116a in the second trench 112 is also removed as much as the thickness of the residual liner nitride layer 116a in the first trench 111. As a result, the residual liner nitride layer 116a in the second trench 112 is also lowered as much as the thickness of the residual liner nitride layer 116a in the first trench 111. In addition, the hard mask pattern 106b is also removed simultaneously with the liner nitride layer 116a, since the hard mask pattern 106b is the same or a similar material as the liner nitride layer 116a.

In the same way, the residual sidewall oxide layer 114a exposed in the first trench 111 is also removed, e.g., by a wet etching process, and the residual sidewall oxide layer 114a in the second trench 112 is also removed as much as the thickness of the residual sidewall oxide layer 114a in the first trench 111. As a result, the residual sidewall oxide layer 116a in the second trench 112 is also lowered as much as the thickness of the residual sidewall oxide layer 114a in the first trench 111. In addition, the pad oxide pattern 102b is also removed simultaneously with the residual sidewall oxide layer 114a since the pad oxide pattern 102b is the same or a similar material as the residual sidewall oxide layer 114a.

The residual insulation layer 118a, the residual liner nitride layer 116a and the residual sidewall oxide layer 114a remain only in the second trench 112, and the first trench 111 is completely opened. The residual insulation layer 118a in the second trench 112 functions as a device isolation layer 118b in the recessed channel transistor 10.

Figure 15:
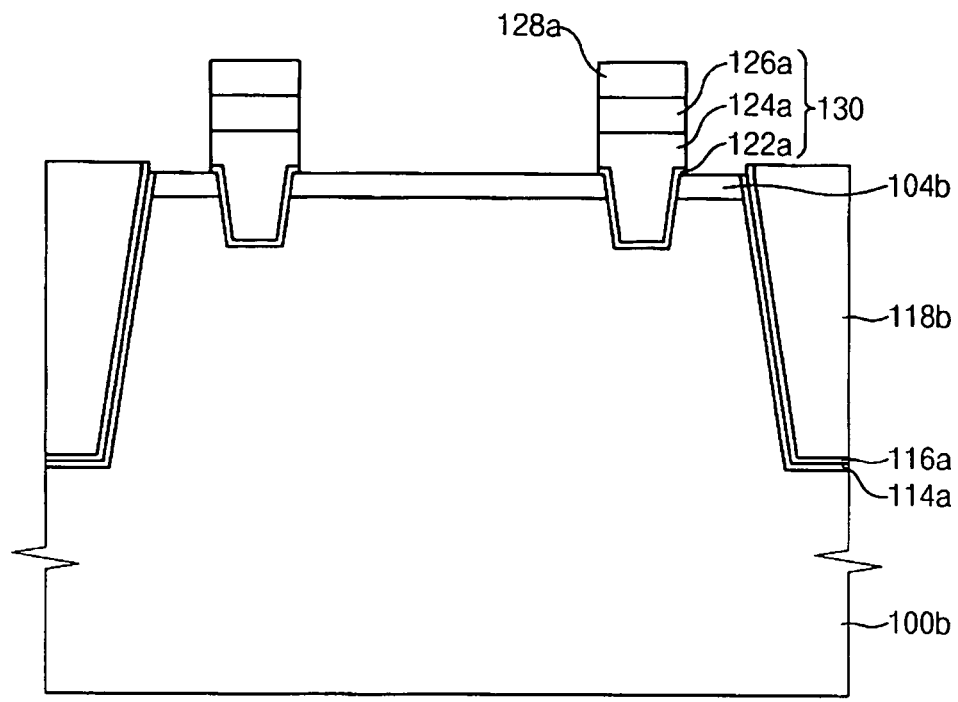
Figure 16:
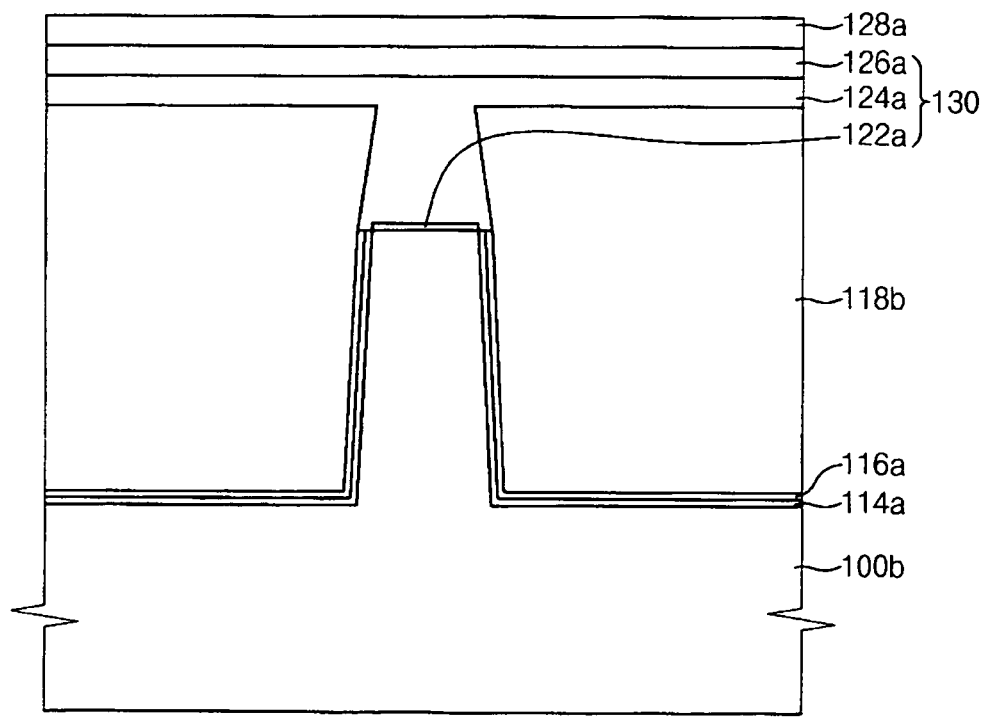

Referring to FIGS. 15 and 16, a gate electrode is formed in a first trench. In this particular example, a gate insulation layer (not shown) may be formed on the substrate 100b and on the sidewall and bottom of the first trench 111 in the active region. A thermal oxidation process may be utilized for the gate insulation layer. A polycrystalline silicon layer (not shown) may be formed on the gate insulation layer to a sufficient thickness to fill the first trench 111. A tungsten silicide layer (not shown) and a hard mask layer (not shown) may be sequentially formed on the polycrystalline silicon layer.

Next, the hard mask layer is partially removed, e.g., by a dry etch process, using a photoresist pattern as an etching mask to thereby form a hard mask pattern 128a. The photoresist pattern is then removed after completing the hard mask pattern 128a. The tungsten silicide layer, the polycrystalline layer and the gate insulation layer are sequentially and partially removed, e.g., by a dry etch process, using the hard mask pattern as an etching mask to thereby form a tungsten silicide pattern 126a, a polycrystalline pattern 124a and a gate insulation pattern 122a. The tungsten silicide pattern 126a, the polycrystalline pattern 124a and the gate insulation pattern 122a form a recessed gate electrode 130. Accordingly, the recessed gate electrode 130 that is recessed in the first trench 111 and metal wiring, such as a word line (not shown), is formed to thereby complete the recessed channel transistor 10 of the present invention.

According to the present embodiment, the first trench for the recessed gate electrode is formed prior to the second trench defining an active region on a substrate, and a device isolation layer for isolating semiconductor structures on the active region is formed in the second trench prior to forming the gate electrode in the first trench, and thus the formation of a silicon fence between the gate trench and the field trench may be avoided.

Embodiment 2

FIGS. 17 to 24 illustrate cross-sectional views of stages in a method of manufacturing the recessed channel transistor shown in FIG. 1 according to a second embodiment of the present invention. In the same manner as in Embodiment 1, odd numbered figures illustrate cross-sectional views taken along the line I–I' of FIG. 1, and even numbered figures illustrate cross-sectional views taken along the line II–II' of FIG. 1. In Embodiment 1, the trench for the recessed gate electrode is formed prior to the trench for defining the active region. In Embodiment 2, the trench for defining the active region is formed prior to the trench for the recessed gate electrode. Embodiment 2 generally uses the same method of manufacturing the recessed channel transistor as Embodiment 1, except for the above difference of the formation order between the trench for the recessed gate electrode and the trench for defining the active region. Thus, the same reference numerals denote the same elements in Embodiment 1, and detailed descriptions of the same elements are omitted.

The silicon substrate 100 including preliminary source/drain regions 104, the pad oxide layer 102 and the hard mask layer 106 are provided as described above with reference to FIG. 2.

Figure 17:
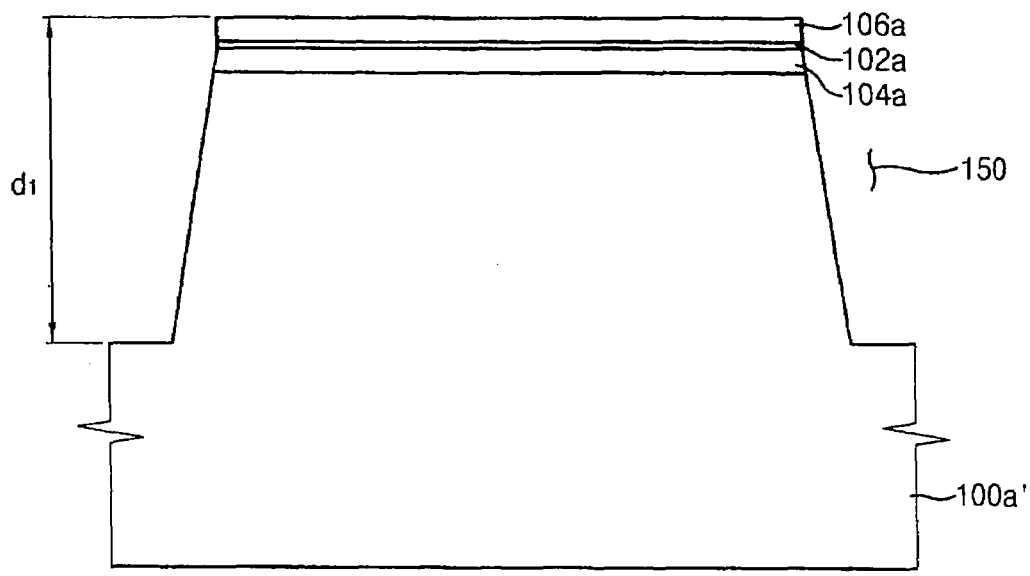
FIGS. 17 to 24 illustrate cross-sectional views of stages in a method of manufacturing the recessed channel transistor shown in FIG. 1 according to a second embodiment of the present invention.
Figure 18:
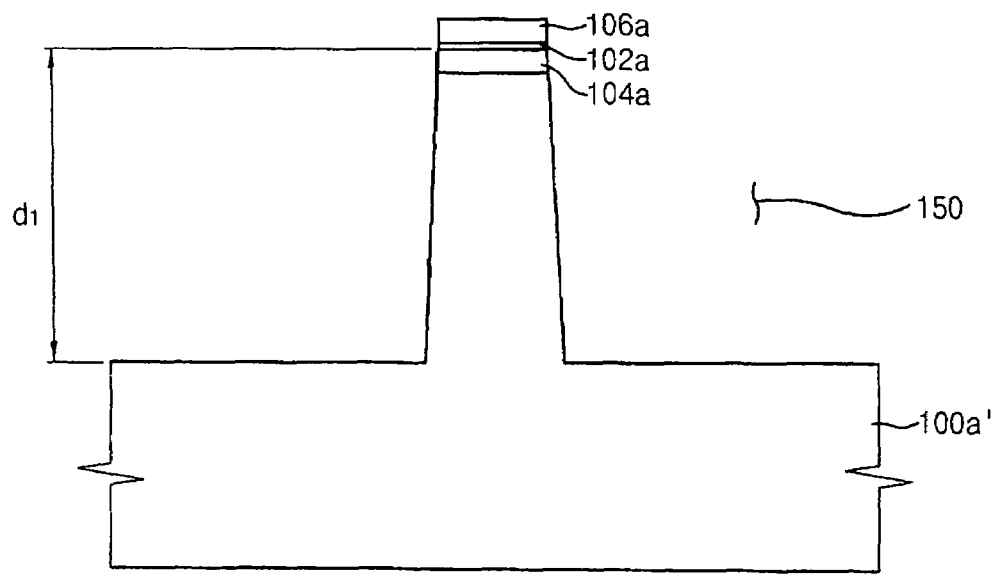

Referring to FIGS. 17 and 18, a first photoresist film (not shown) is formed on the hard mask layer 106, and a first photoresist pattern (not shown) is formed in an X direction in FIG. 1 by a photo process (exposing and developing), such that a portion of the hard mask layer corresponding to the active region 20 (shown in FIG. 1) is covered with the first photoresist pattern and a portion of the hard mask pattern corresponding to the field region is exposed through the first photoresist pattern. The exposed hard mask layer 106 in the field region is partially removed, e.g., by a dry etching process, using the first photoresist pattern as an etching mask to form a hard mask pattern 106a on the pad oxide layer 102. The hard mask pattern 106a covers the active region 20 in the X direction and exposes the field region surrounding the active region. The pad oxide layer 102 on the field region is partially exposed through the hard mask pattern 106a. The pad oxide layer 102 and the substrate 100 under the pad oxide layer 102 are sequentially and partially etched away to a first etching depth $d_1$, using the hard mask pattern 106a as an etching mask. Accordingly, the pad oxide layer is formed into a pad oxide pattern 102a and a preliminary trench 150 is formed in the field region of the substrate 100 at the first etching depth $d_1$. The substrate 100 including the preliminary trench 150 is denoted by reference numeral 100a'.

Figure 19:
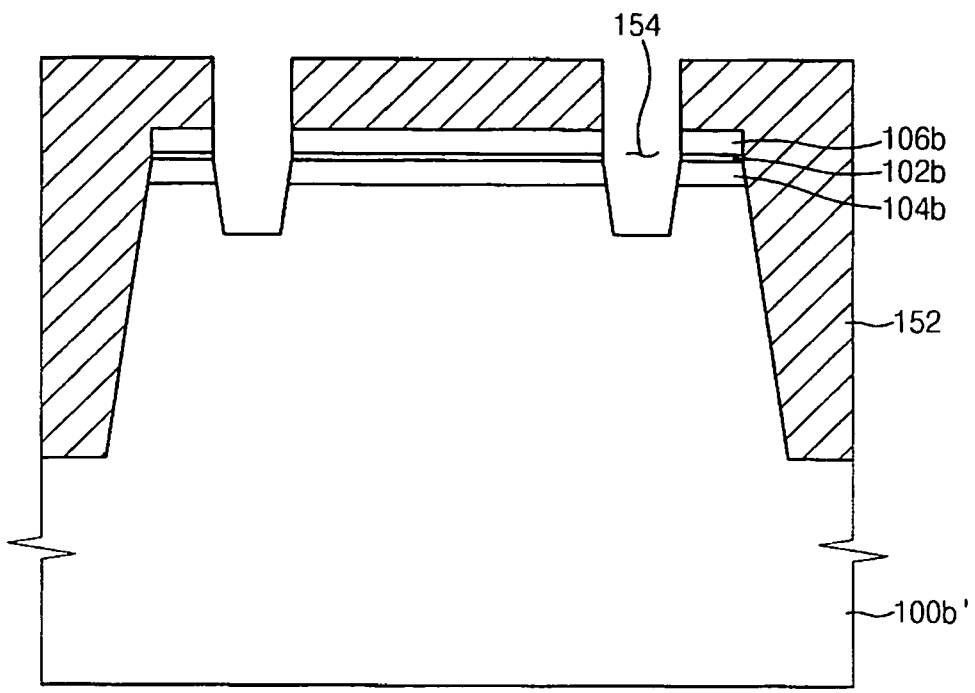
Figure 20:
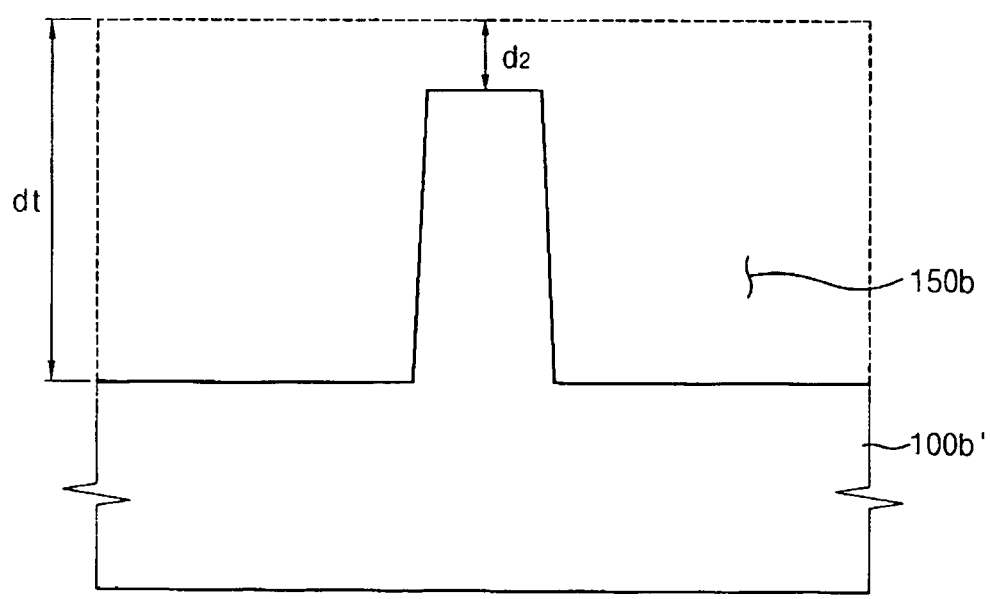

Referring to FIGS. 19 and 20, a photoresist material is again provided on the substrate 100a', including the preliminary trench 150, to form a second photoresist film (not shown) on the substrate 100a'. A photo process is performed on the second photoresist film to form a second photoresist pattern 152 in a Y direction, substantially perpendicular to the X direction, as shown in FIG. 1. Since the active region 20 shown in FIG. 1 of the present embodiment extends in the X direction, a portion of the active region crosses the second photoresist pattern 152. The second photoresist pattern 152 exposes the crossed portion of the active region and a portion of the preliminary trench 150 neighboring the crossed portion of the active region along the Y direction, and fills a residual of the preliminary trench 150 in the field region. In the same way as described Embodiment 1, the exposed preliminary trench 150 by the second photoresist pattern along the Y direction is referred to as a deep preliminary trench 150b, and the residual preliminary trench 150, except for the exposed preliminary trench, is referred to as a shallow preliminary trench 150a.

The hard mask pattern 106a, the pad oxide pattern 102a and the substrate 100a exposed through the second photoresist pattern 152 in the active region are removed, e.g., by a dry etch process, to a second etching depth $d_2$, forming a second trench 154 on the substrate 100a to the second etching depth $d_2$ in the active region 20. In the present embodiment, the second etching depth $d_2$ is less than the first etching depth $d_1$. Meanwhile, a bottom surface of the deep preliminary trench 150b is additionally etched away to the second etching depth $d_2$ during the etching process for the second trench 154. As a result, a total etching depth $d_t$ of the deep preliminary trench 150b equals the sum of the first etching depth $d_1$ and the second etching depth $d_2$. The preliminary trench 150 is formed into a first trench including the deep preliminary trench 150b and the shallow preliminary trench 150a. That is, the preliminary trench 150 is formed into the shallow preliminary trench 150a and the deep preliminary trench 150b during the etching process for the second trench 154.

Hereinafter, the portion of substrate 100a' that includes the second trench 154 is denoted by reference numeral 100b', to thereby distinguish the other portion of substrate 100a' in which the second trench 154 is not formed. In the same way, the hard mask pattern 106a, the pad oxide pattern 102a and the preliminary source/drain regions 104a are also denoted as reference numerals 106b, 102b and 104b. The recessed gate electrode 40 is formed at the second trench 154 of the substrate 100b'.

Figure 21:
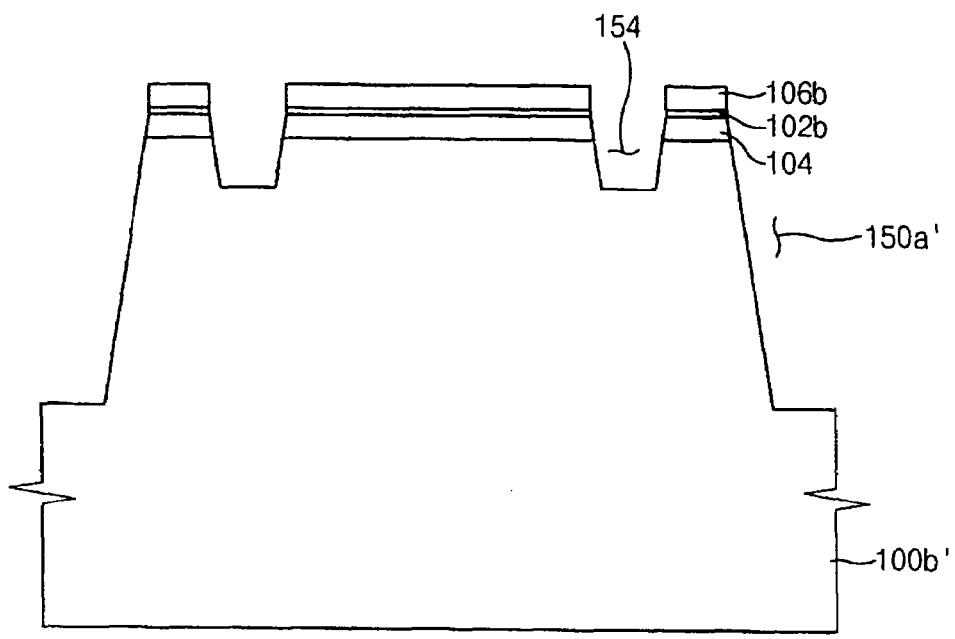
Figure 22:
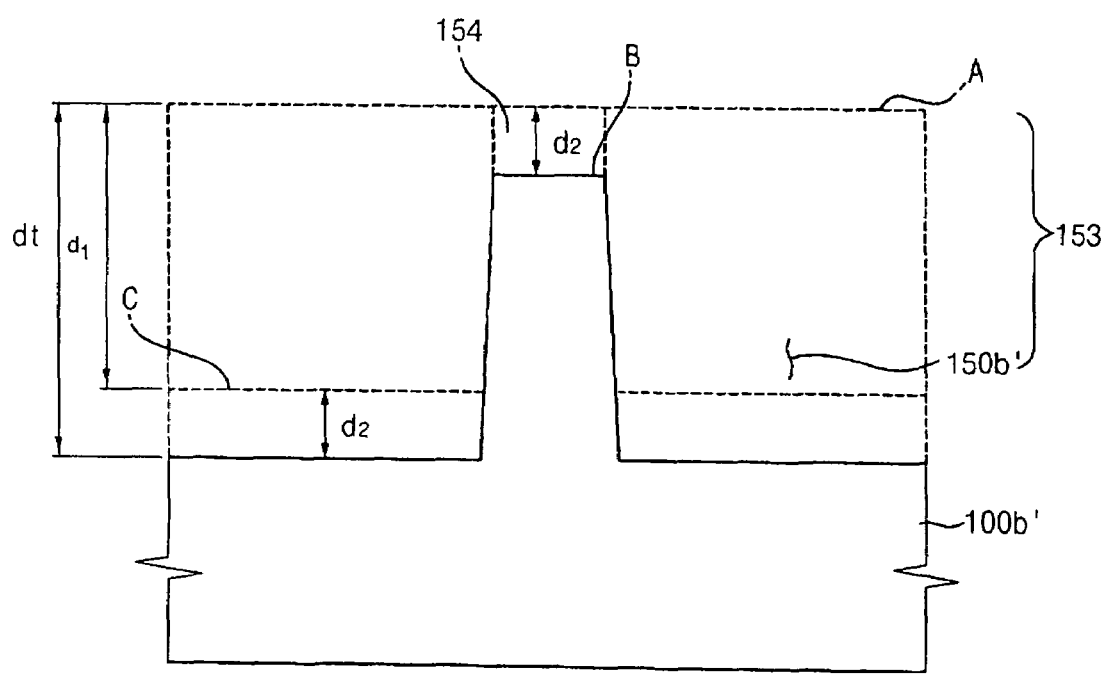

Referring to FIGS. 21 and 22, the second photoresist pattern 152 is removed from the substrate 100b', and the shallow preliminary trench 150a is exposed. The preliminary trench 150 is formed into a first trench including the deep preliminary trench 150b and the shallow preliminary trench 150a. As a result, a first trench 153 and the second trench 154 are formed in the field region and the active region of the substrate 100b', respectively. The recessed gate electrode 40 is formed in the second trench 154 and a device isolation layer for electrically isolating conductive structures is formed in the first trench 153 in a subsequent process. The preliminary source/drain regions 104b adjacent to the second trench 154 are formed into source/drain regions 104.

In the present embodiment, the second trench 154 functioning as a gate trench is formed prior to the device isolation layer in the first trench 153 functioning as a field trench, so that the device isolation layer has no effect on the etching process for the second trench 154. As a result, the formation of a silicon fence between the gate trench and the field trench may be avoided.

As shown in FIG. 22, the first trench 153 is etched away to the first etching depth $d_1$ from a top surface A of the substrate 100b'. The bottom surface of the first trench 153 is represented by reference letter C in FIG. 22. The second trench 154 is etched away from the top surface A of the substrate 100b' to the second etching depth $d_2$. When the second trench 154 is etched away, the first trench partially exposed through the second photoresist pattern 152 is additionally etched away from the bottom surface C thereof to the second etching depth $d_2$. That is, a total depth $d_t$ of the deep preliminary trench 150b of the first trench 153 is greater than the depth of the shallow preliminary trench 150a of the first trench 153 by an amount of the first etching depth $d_1$.

Figure 23:
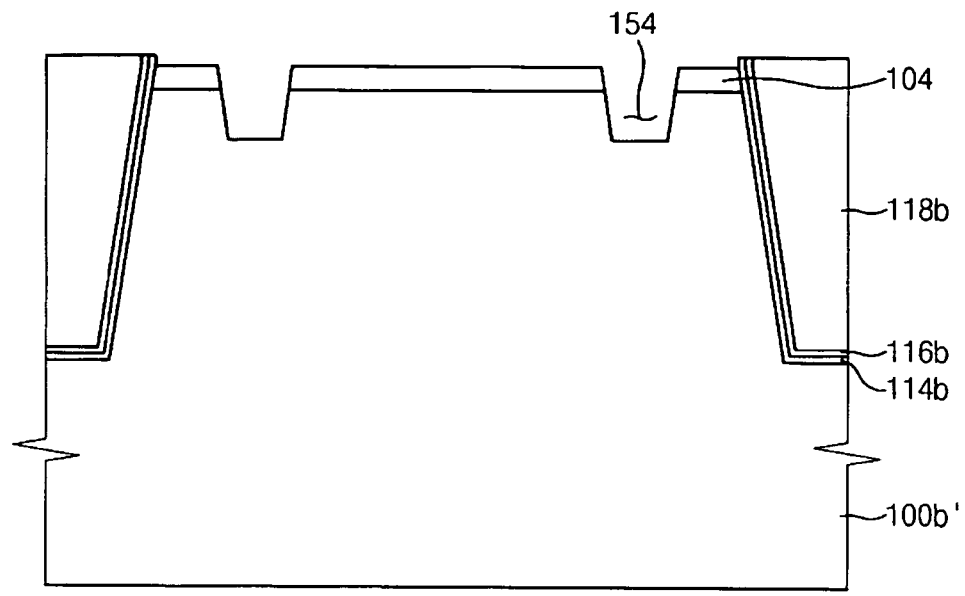
Figure 24:
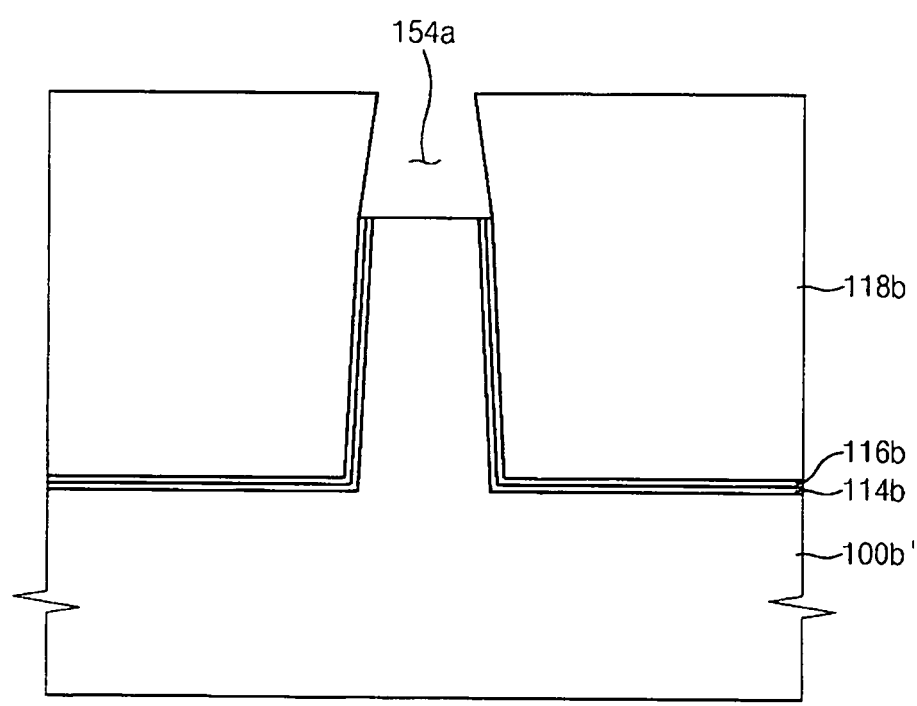

Referring to FIGS. 23 and 24, the device isolation layer 118b enclosing the active region may be formed in the first trench 153 and the second trench 154 in the active region may be provided for the recessed gate electrode in the same manner as in Embodiment 1.

In detail, a sidewall oxide layer (not shown) and a liner nitride layer (not shown) are sequentially formed on sidewalls and bottoms of the first and second trenches 153 and 154 and on the top surface of the hard mask pattern in the active region. An insulation material is deposited onto the substrate 100b' to a sufficient thickness to fill the first and second trenches 153 and 154 and to form an insulation layer on the liner nitride layer. As described in Embodiment 1, the deposition conditions are controlled such that a gap-fill property of the insulation layer is good in the first trench 153 and is poor in the second trench 154. As a result, the insulation layer is formed in the first trench 153 without any processing failures, whereas the insulation layer is intentionally formed in the second trench 154 with an overhang failure around an inlet portion of the second trench 154. Accordingly, a void is intentionally generated inside the insulation layer in the second trench 154.

The insulation layer is removed, e.g., by a chemical mechanical polishing (CMP) process, until the top surface of the hard mask pattern is exposed, so that a residual insulation layer, a residual nitride layer and a residual oxide layer remain in the first and second trenches 153 and 154. Here, the liner nitride layer on the active region is polished more than the insulation layer during the CMP process, so that a top surface of the residual insulation layer in the first trench 153 is higher than the top surface of the hard mask pattern in the active region of the substrate 100b'. In addition, the void inside the insulation layer is exposed, and the second trench 154 that is filled with the insulation layer is partially opened corresponding to the void.

Subsequently, the residual insulation layers in the first and second trenches 153 and 154 are removed by a wet etching process, so that the residual insulation layer is completely removed and the liner nitride layer is exposed in the second trench 154. The residual liner nitride layer in the second trench 154 and the hard mask pattern in the active region are simultaneously removed from the substrate 100b', and the sidewall oxide layer in the second trench 154 and the pad oxide layer in the active region are also simultaneously removed from the substrate 100b' in the same manner as described in Embodiment 1.

Accordingly, the residual insulation layer, the residual liner nitride layer and the residual sidewall oxide layer remain only in the first trench 153, and the second trench 154 is completely exposed. The residual insulation layer in the first trench 153 functions as the device isolation layer 118b in the recessed channel transistor 10. Then, the recessed gate electrode 40 is formed in the second trench 154, and metal wiring such as a word line is formed in the same way as described in Embodiment 1, to thereby complete the recessed channel transistor.

According to the present embodiment, the trench for the recessed gate electrode is formed after the trench defining the active region on the substrate, and thus the formation of a silicon fence between the gate trench and the field trench may be avoided.

According to the present invention, the gate trench is etched away prior to the formation of the device isolation layer, so that the device isolation layer is not an obstacle for the etching process. As a result, the etching process for the gate trench is improved, and the formation of a silicon fence between the gate trench and the field trench may be avoided. In addition, additional processing steps for removing the silicon fence are not required, thus promoting the efficient production of semiconductor devices.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor device, comprising:

forming a first trench in a first region of a substrate and a second trench in a second region of the substrate different from the first region, the first trench being shallower than the second trench;

forming an insulation layer in the second trench, so that semiconductor structures formed in the first trench are electrically isolated; and forming a conductive layer filling the first trench and extending above the first trench, wherein forming the insulation layer includes:

sequentially forming an oxide layer and a nitride layer along sidewalls and bottoms of the first and second trenches and on a surface of the first region;

filling the first and second trenches with an insulation material to thereby form an insulation layer on the substrate such that the insulation layer includes a void in the first trench;

polishing the insulation layer until a top surface of the nitride layer is exposed in the first region, so that a portion of the first trench is exposed corresponding to the void; and removing the insulation layer in the first trench.

2. The method of manufacturing a semiconductor device as claimed in claim 1, wherein forming the conductive layer comprises:

forming a gate insulation layer on a bottom and sidewalls of the first trench and on a surface of the substrate in the first region;

filling the first trench with a gate conductive material; and partially and sequentially removing the gate conductive material and the gate insulation layer, so that the gate insulation layer and the gate conductive material remain only in the first trench.

3. A method of fabricating a semiconductor device, comprising:

forming a preliminary source/drain region on a substrate including a hard mask layer;

forming a first trench in an active region of the substrate and a second trench in a field region of the substrate, the second trench defining the active region and being deeper than the first trench;

forming an isolation layer by filling the second trench with an insulating material; and forming a gate electrode by filling the first trench with a conductive material, wherein forming the first and second trenches includes:

forming a preliminary trench to a first depth in a first direction, wherein the preliminary trench includes a portion of the active region, and wherein the portion of the preliminary trench corresponding to the active region is formed into a first trench; and forming a second trench in the field region to a second depth greater than the first depth such that the active region is surrounded by the second trench, so that the second trench has a stepped portion on a bottom thereof corresponding to the first depth.

4. The method of manufacturing a semiconductor device as claimed in claim 3, wherein forming the preliminary trench comprises:

forming a first photoresist pattern on the hard mask layer in the first direction, through which a portion of the active region is exposed; and sequentially etching the hard mask layer and the substrate under the hard mask layer to the first depth using the photoresist pattern as an etching mask, so that the preliminary trench including the portion of the active region is formed in the substrate in the first direction.

5. The method of manufacturing a semiconductor device as claimed in claim 4, wherein forming the second trench comprises:

forming a second photoresist pattern on the substrate in a second direction substantially perpendicular to the first direction, so that the active region is covered with the second photoresist pattern and the field region surrounding the active region is exposed through the second photoresist pattern and a portion of the preliminary trench in the active region is filled with the second photoresist pattern;

etching the substrate in the field region to the second depth using the second photoresist pattern as an etching mask, so that the second trench is formed in the field region around the active region; and removing the second photoresist pattern, so that the portion of the preliminary trench in the active region is exposed to thereby form the first trench.

6. A method of fabricating a semiconductor device, comprising:

forming a preliminary source/drain region on a substrate including a hard mask layer;

forming a first trench in an active region of the substrate and a second trench in a field region of the substrate, the second trench defining the active region and being deeper than the first trench;

forming an isolation layer by filling the second trench with an insulating material; and forming a gate electrode by filling the first trench with a conductive material wherein forming the first and second trenches includes;

forming a preliminary trench in the field region of the substrate to a first depth such that the active region is surrounded by the preliminary trench; and forming a second trench in a portion of the active region to a second depth, wherein the second depth is less than the first depth, so that the preliminary trench is formed into a first trench having a stepped portion thereof on a bottom thereof corresponding to the second depth.

7. The method of manufacturing a semiconductor device as claimed in claim 6, wherein forming the preliminary trench comprises:

forming a first photoresist pattern on the substrate in a first direction substantially parallel with the active region, so that the active region is covered with the first photoresist pattern and the field region surrounding the active region is exposed through the first photoresist pattern; and etching the substrate in the field region to the first depth using the first photoresist pattern as an etching mask, so that the preliminary trench is formed in the field region around the active region to the first depth.

8. The method of manufacturing a semiconductor device of claim 7, wherein forming the second trench comprises:
   forming a second photoresist pattern through which a portion of the active region is exposed on the hard mask layer in a second direction substantially perpendicular to the first direction;
   sequentially etching the hard mask layer and the substrate under the hard mask layer to the second depth using the second photoresist pattern as an etching mask, so that a portion of the active region is etched away to the second depth to thereby form the second trench, and a portion of the preliminary trench adjacent to the second trench in the first direction is additionally etched away to thereby form the stepped portion on the bottom of the preliminary trench; and
   removing the second photoresist pattern, so that the preliminary trench in the field region is exposed to thereby form the first trench.

9. A method of fabricating a semiconductor device, comprising:
   forming a preliminary source/drain region on a substrate including a hard mask layer;
   forming a first trench in an active region of the substrate and a second trench in a field region of the substrate, the second trench defining the active region and being deeper than the first trench;
   forming an isolation layer by filling the second trench with an insulating material; and
   forming a gate electrode by filling the first trench with a conductive material, wherein forming the device isolation layer includes:
   forming an insulation layer on the substrate to a thickness to fill the first and second trenches such that a void is formed in the first trench;
   polishing the insulation layer until a top surface of the substrate is exposed in the active region, so that the void is exposed and the first trench is partially opened corresponding to the void; and
   removing the insulation layer in the first trench, so that the insulation layer remains only in the second trench to form the device isolation layer in the second trench.

10. The method of manufacturing a semiconductor device as claimed in claim 9, further comprising sequentially forming an oxide layer and a nitride layer on bottoms and sidewalls of the first and second trenches and on a surface of the hard mask layer prior to forming the insulation layer, and wherein the insulation layer is polished until a top surface of the hard mask layer is exposed, and the nitride layer and the oxide layer in the active region are sequentially removed.

11. The method of manufacturing a semiconductor device as claimed in claim 10, wherein the hard mask layer comprises a same material as the nitride layer, so that the hard mask layer is removed when the nitride layer is removed.

12. The method of manufacturing a semiconductor device as claimed in claim 9, further comprising an overhang around an inlet portion of the first trench in the insulation layer.

13. A method of fabricating a semiconductor device, comprising:
   forming a preliminary source/drain region on a substrate including a hard mask layer;
   forming a first trench in an active region of the substrate and a second trench in a field region of the substrate, the second trench defining the active region and being deeper than the first trench;
   forming an isolation layer by filling the second trench with an insulating material; and
   forming a gate electrode by filling the first trench with a conductive material, wherein forming the gate electrode includes:
   forming a gate insulation layer on a bottom and sidewalls of the first trench and on the surface of the substrate in the active region;
   forming a conductive layer on the gate insulation layer to a thickness to fill the first trench;
   forming a hard mask layer on the conductive layer; and
   partially and sequentially removing the hard mask layer, the conductive layer and the gate insulation layer such that a residual gate insulation layer remains only in the first trench, and a residual conductive layer and a residual hard mask layer are stacked on the residual gate insulation layer to thereby form the gate electrode in the active region.

14. The method of manufacturing a semiconductor device as claimed in claim 13, wherein the conductive layer includes a silicon layer comprising polycrystalline material.

15. The method of manufacturing a semiconductor device as claimed in claim 14, wherein the conductive layer further includes a tungsten silicide layer on the silicon layer.

16. The method of manufacturing a semiconductor device as claimed in claim 13, wherein removing the hard mask layer, the conductive layer and the gate insulation layer comprises:
   forming a photoresist pattern on the hard mask layer; and
   partially and sequentially dry-etching the hard mask layer, the conductive layer and the gate insulation layer.

* * * * *